United States Patent
Choung

(10) Patent No.: US 9,496,457 B2
(45) Date of Patent: Nov. 15, 2016

(54) LIGHT EMITTING DEVICE AND LIGHT EMITTING DEVICE PACKAGE

(71) Applicant: LG INNOTEK CO., LTD., Seoul (KR)

(72) Inventor: Jae Woong Choung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 106 days.

(21) Appl. No.: 14/391,740

(22) PCT Filed: Apr. 26, 2013

(86) PCT No.: PCT/KR2013/003656
§ 371 (c)(1),
(2) Date: Oct. 10, 2014

(87) PCT Pub. No.: WO2013/162337
PCT Pub. Date: Oct. 31, 2013

(65) Prior Publication Data
US 2015/0076535 A1    Mar. 19, 2015

(30) Foreign Application Priority Data

Apr. 27, 2012 (KR) .......... 10-2012-0044325

(51) Int. Cl.
| | |
|---|---|
| *H01L 33/00* | (2010.01) |
| *H01L 33/08* | (2010.01) |
| *H01L 33/18* | (2010.01) |
| *H01L 33/24* | (2010.01) |
| *H01L 33/32* | (2010.01) |
| *H01L 33/38* | (2010.01) |
| *H01L 33/40* | (2010.01) |
| *H01L 33/28* | (2010.01) |

(52) U.S. Cl.
CPC .............. *H01L 33/08* (2013.01); *H01L 33/18* (2013.01); *H01L 33/24* (2013.01); *H01L 33/32* (2013.01); *H01L 33/387* (2013.01); *H01L 33/40* (2013.01); *H01L 33/28* (2013.01); *H01L 2224/48091* (2013.01)

(58) Field of Classification Search
CPC ............................... H01L 33/02; H01L 33/36
USPC ................................................ 257/98–100
See application file for complete search history.

(56) References Cited

U.S. PATENT DOCUMENTS

| | | | |
|---|---|---|---|
| 2005/0199894 A1* | 9/2005 | Rinzler | ............... B82Y 10/00 257/94 |
| 2010/0133569 A1 | 6/2010 | Li et al. | |
| 2011/0114924 A1 | 5/2011 | Aurongzeb et al. | |
| 2012/0061646 A1 | 3/2012 | Yi et al. | |
| 2013/0187128 A1 | 7/2013 | Yi et al. | |

FOREIGN PATENT DOCUMENTS

| | | |
|---|---|---|
| KR | 10-2010-0042122 A | 4/2010 |
| KR | 10-1061150 B1 | 8/2011 |
| KR | 10-2012-0036129 A | 4/2012 |

* cited by examiner

*Primary Examiner* — Samuel Gebremariam
(74) *Attorney, Agent, or Firm* — Birch, Stewart, Kolasch & Birch, LLP

(57) ABSTRACT

Disclosed are a light emitting device, a method of manufacturing the same, a light emitting device package, and a lighting system. The light emitting device includes a substrate; a plurality of conductive dielectric nano rods spaced apart from each other on the substrate; light emitting structures on the conductive dielectric nano rods, respectively; and a carbon nano electrode layer on the light emitting structures.

20 Claims, 8 Drawing Sheets

LIGHT EMITTING DEVICE AND LIGHT EMITTING DEVICE PACKAGE

TECHNICAL FIELD

The embodiment relates to a light emitting device, a method of manufacturing the same, a light emitting device package, and a lighting system.

BACKGROUND ART

A light emitting device has a property to convert electric energy into photo energy. For instance, the light emitting device may represent various colors by adjusting the compositional ratio of compound semiconductors.

According to the related art, a transparent ohmic layer is formed on a light emitting structure including an N type GaN layer, an active layer and a P type GaN layer.

The transparent ohmic layer used in the light emitting device according to the related art mainly includes ITO-based oxides. Such metal oxides are transparent and have relatively superior electric conductivity so the metal oxides are used for an electrode contact layer of the light emitting device.

Recently, various studies and research have been performed in a nitride semiconductor light emitting device to manufacture a high-brightness LED. However, since there is possibility of depletion of indium (In), which is a main material of an ITO electrode extensively used in the related art, the cost of indium (In) is increased so that the manufacturing cost for the ITO electrode is increased. In addition, since the ITO electrode has no flexibility, the ITO electrode is not suitable for flexible devices.

In addition, the transparent ohmic layer used in the light emitting device needs to have superior light transparency and high surface-direction electric conductivity. However, according to the related art, there is no optimum transparent ohmic layer having a thin thickness and capable of increasing the surface-direction electric conductivity.

A nitride semiconductor light emitting device according to the related art represents various problems due to the lack of the optimum transparent ohmic layer, such as non-uniform current injection, low heat dissipation efficiency and low light extraction efficiency.

In addition, according to the related art, it is necessary to improve the light emitting efficiency and reliability of the light emitting device in order to implement high-power light emitting device. For instance, according to the related art, many attempts have been tried to improve the configuration of a light emitting structure that emits light, but the satisfied result is not obtained.

DISCLOSURE OF INVENTION

Technical Problem

The embodiment provides a light emitting device capable of enhancing the intensity of light by improving a transparent ohmic layer, a method of manufacturing the same, a light emitting device package, and a lighting system.

The embodiment provides a light emitting device having high performance by improving light emitting efficiency and reliability through modification of the configuration of a light emitting structure, a method of manufacturing the same, a light emitting device package, and a lighting system.

Solution to Problem

A light emitting device according to the embodiment may include a substrate; a plurality of conductive dielectric nano rods spaced apart from each other on the substrate; light emitting structures on the conductive dielectric nano rods, respectively; and a carbon nano electrode layer on the light emitting structures.

A light emitting device according to the embodiment may include a substrate; a plurality of conductive dielectric nano rods spaced apart from each other on the substrate; light emitting structures on the conductive dielectric nano rods, respectively; and a carbon nano electrode layer on the light emitting structures, wherein the light emitting structures have a coaxial structure.

A light emitting device according to the embodiment may include a substrate; a plurality of conductive dielectric nano rods spaced apart from each other on the substrate; light emitting structures surrounding the conductive dielectric nano rods, respectively; a carbon nano electrode layer on the light emitting structures; and an electrode layer on a lateral side of the second conductive semiconductor layer.

Advantageous Effects of Invention

The embodiment can provide a light emitting device capable of enhancing the intensity of light by improving a transparent ohmic layer, a method of manufacturing the same, a light emitting device package, and a lighting system.

Further, the embodiment can provide a light emitting device having high performance by improving light emitting efficiency and reliability, a method of manufacturing the same, a light emitting device package, and a lighting system.

In addition, according to the embodiment, a flexible device structure having the superior mechanical property can be realized by hybridizing the carbon nano layer and the light emitting structure having the coaxial nano rod structure.

MODE FOR THE INVENTION

Hereinafter, a light emitting device, a light emitting device package, and a lighting system according to embodiments will be described in detail with reference to accompanying drawings.

In the description of embodiments, it will be understood that when a layer (or film) is referred to as being "on" another layer or substrate, it can be directly on another layer or substrate, or intervening layers may also be present. Further, it will be understood that when a layer is referred to as being "under" another layer, it can be directly under another layer, and one or more intervening layers may also be present. In addition, it will also be understood that when a layer is referred to as being "between" two layers, it can be the only layer between the two layers, or one or more intervening layers may also be present.

Figure 1:
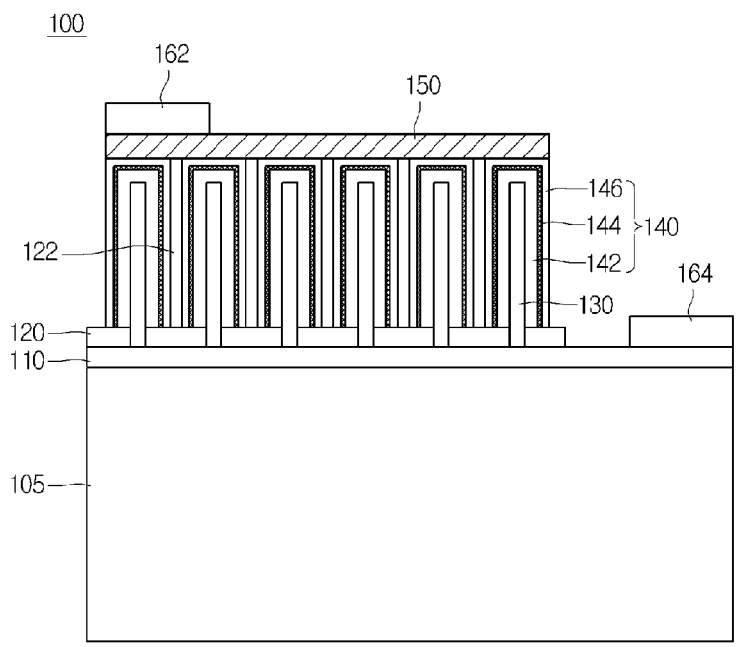
FIG. 1 is a sectional view showing a light emitting device according to the first embodiment.
Figure 2:
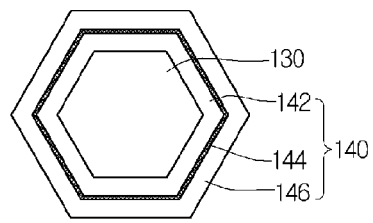
FIG. 2 is a partial sectional view showing a light emitting device according to the embodiment.

FIG. 1 is a sectional view showing a light emitting device 100 according to the first embodiment. Although FIG. 1 shows a lateral type light emitting device, the embodiment is not limited thereto. FIG. 2 is a partial cross sectional view showing a nano rod type light emitting structure 140 and a conductive dielectric nano rod 130 of the light emitting device 100 according to the embodiment.

According to the embodiment, the embodiment is not limited to the conductive dielectric nano rod 130, and a conductive semiconductor nano rod 130 may be used instead of the conductive dielectric nano rod.

The light emitting device 100 according to the embodiment may include a substrate 105, a plurality of conductive dielectric nano rods 130 formed on the substrate 105 while being spaced apart from each other, and light emitting structures 140 formed on the conductive dielectric nano rods 130, respectively, and a carbon nano electrode layer 150 formed on the light emitting structures 140.

According to the embodiment, the conductive dielectric nano rods 130 may be formed in the coaxial structure. For instance, the light emitting structures 140 may surround the conductive dielectric nano rods 130, respectively.

In detail, the light emitting structure 140 may include a first conductive semiconductor layer 142 surrounding the conductive dielectric nano rod 130, an active layer 144 on the first conductive semiconductor layer 142 and a second conductive semiconductor layer 146 on the active layer 144.

The active layer 144 may surround the first conductive semiconductor layer 142 and the second conductive semiconductor layer 146 may surround the active layer 144.

Thus, the first conductive semiconductor layer 142, the active layer 144 and the second conductive semiconductor layer 146 may have the coaxial structure.

For instance, the first conductive semiconductor layer 142, the active layer 144 and the second conductive semiconductor layer 146 may be coaxially formed surrounding the conductive dielectric nano rod 130.

According to the embodiment, since the light emitting structure may have the coaxial structure, the internal quantum efficiency can be significantly increased. For instance, as shown in FIG. 1, the light emitting structure according to the embodiment is formed from a lower portion to an upper portion of the conductive dielectric nano rod 130, so the area of the active layer 144 can be significantly enlarged. In addition, since a plurality of nano rod type light emitting structures including the enlarged light emitting area are provided, the internal quantum efficiency can be remarkably increased as compared with the light emitting device according to the related art.

The rod type light emitting structure has been adopted in the related art. However, since the rod type light emitting structure according to the related art includes an n-GaN, an active layer and a p-GaN, which are vertically stacked, the area of the active layer is so narrow that the light emitting area is significantly reduced as compared with that of the light emitting structure according to the embodiment. In contrast, the light emitting area may be significantly increased in the light emitting device according to the embodiment, so the light emitting efficiency can be maximized.

According to the embodiment, the conductive dielectric nano rod 130 may include a ZnO nano rod, but the embodiment is not limited thereto.

For example, the conductive dielectric nano rod 130 may include $TiO_2$ or Conductive Polymeric Layer.

According to the embodiment, the conductive dielectric nano rod 130 may be disposed at the coaxial center of the light emitting structure 140 so that the light scattering effect and the light transmittance can be improved.

In addition, according to the embodiment, since the conductive dielectric nano rod 130 has superior electric conductivity, the conductive dielectric nano rod 130 can electrically make ohmic-contact with the first conductive semiconductor layer 142 of the light emitting structure 140, so that the carrier can be effectively injected into the light emitting structure 140, thereby maximizing the light emitting efficiency.

For instance, it is necessary to sufficiently inject the carrier in order to maximize the light emitting efficiency of the light emitting structure having the coaxial structure. Since the conductive dielectric nano rod 130 serving as the coaxial center has the superior electric conductivity, the current injection efficiency can be maximized so that the carrier can be sufficiently injected into the light emitting structure, thereby improving the light emitting efficiency.

In addition, according to the embodiment, since the light emitting structure has the coaxial nano rod structure, the surface area for light extraction can be increased so that the light extraction efficiency can be increased.

According to the embodiment, a nitride semiconductor layer 110 may be further provided between the substrate 105 and the conductive dielectric nano rod 130 such that the conductive dielectric nano rod 130 can be electrically connected to the nitride semiconductor layer 110. Thus, the light emitting device can be electrically driven. In addition, the conductive dielectric nano rod 130 having high quality without defect, such as crack, is formed on the nitride semiconductor layer 110, so that the light emitting efficiency of the light emitting device can be improved.

Further, according to the embodiment, first insulating layers 120 are interposed between the conductive dielectric nano rods 130, respectively, thereby preventing the electric short from occurring between the light emitting structures 140. The first insulating layer can be formed on the nitride semiconductor layer 110, and the first insulating layer 110 may have a hole. And the conductive dielectric nano rod 130 may be formed on the nitride semiconductor layer 110 through the hole.

The first insulating layer 120 is a patterned insulating layer before the conductive dielectric nano rod 130 is formed and exposes the nitride semiconductor layer 110 at the region where the conductive dielectric nano rod 130 is formed later, so the conductive dielectric nano rod 130 can be uniformly formed.

According to the embodiment, second insulating layers 122 may be interposed between the light emitting structures 140 formed on the conductive dielectric nano rods 130, respectively, thereby preventing the electric short from occurring between the light emitting structures 140.

According to the embodiment, the carbon nano electrode layer 150 may include a graphene layer, but the embodiment is not limited thereto.

According to the embodiment, graphene used for the carbon nano electrode layer 150 is a carbon thin film having a single atom thickness and represents high transparency and superior thermal and electric conductivity. For instance, the graphene used in the embodiment has the high transparency to the extent that it absorbs only about 2.3% of light, the thermal conductivity of about 5300 W/mK, and the electric conductivity of about 15000 to 200000 $cm^2/Vs$, but the embodiment is not limited thereto.

For instance, the graphene carbon nano electrode layer 150 employed in the embodiment has the 2-dimensional characteristic in the normal temperature and the thermal conductivity higher than that of Ag. In the graphene carbon nano electrode layer 150, electrons may move as if they have a mass of 0, so current flow may faster than that of the semiconductor by at least million times. In addition, the graphene has current density higher than that of copper by about million times and the quantum hall effect (hall resistance has a constant value under a specific condition regardless of materials), which is observed only in the ultralow temperature, is represented in the normal temperature.

In addition, according to the embodiment, the graphene employed in the carbon nano electrode layer 150 has high strength and superior elasticity so the carbon nano electrode layer 150 may not lose the electric property even when the carbon nano electrode layer 150 is stretched or bent.

The carbon nano electrode layer 150 according to the embodiment may be prepared in the form of a single atom graphene layer or a multiple atom graphene layer.

In addition, the carbon nano electrode layer 150 may be prepared in the form of a single layer, a porous layer, or a stripe net having a predetermined pattern, but the embodiment is not limited thereto.

In order to enhance the electric conductivity and the thermal conductivity, the carbon nano electrode layer 150 may have a thickness in the range of 0.1 nm to 100 nm. If the thickness of the carbon nano electrode layer 150 exceeds 100 nm, light absorption in the carbon nano electrode layer 150 is increased so that the characteristic of the light emitting device 100 may be lowered.

In addition, the carbon nano electrode layer 150 may have a thickness in the range of 0.2 nm to 0.325 nm. In this case, the carbon nano electrode layer 150 can be easily formed and may have high electric conductivity and high light transmittance.

According to the embodiment, the carbon nano layer having high thermal conductivity and electric conductivity and superior transparency is used as a transparent electrode layer of the nitride semiconductor light emitting device, so the loss of light absorbed in the electrode can be reduced, thereby improving the light extraction efficiency.

In addition, according to the embodiment, since the carbon nano layer having high thermal conductivity and electric conductivity is used as an electrode layer, the carrier injection efficiency to the light emitting structure having the coaxial structure, in which the light emitting area is significantly increased, can be improved so that the light emitting efficiency can be maximally enhanced.

The embodiment can provide a light emitting device capable of enhancing the intensity of light by improving a transparent ohmic layer, a method of manufacturing the same, a light emitting device package, and a lighting system.

Further, the embodiment can provide a light emitting device having high performance by improving light emitting efficiency and reliability, a method of manufacturing the same, a light emitting device package, and a lighting system.

In addition, according to the embodiment, a flexible device structure having the superior mechanical property can be realized by hybridizing the carbon nano layer and the light emitting structure having the coaxial nano rod structure.

Figure 3:
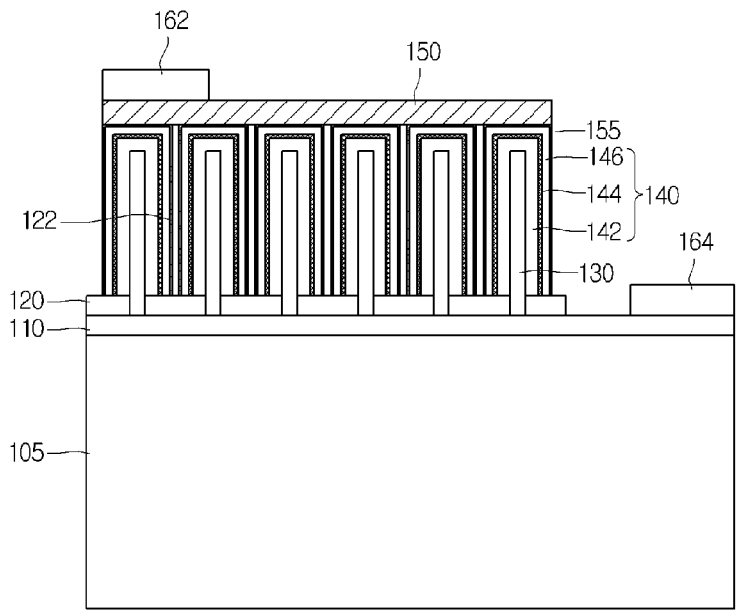
FIG. 3 is a sectional view showing a light emitting device according to the second embodiment.

FIG. 3 is a sectional view showing a light emitting device 102 according to the second embodiment.

The light emitting device 102 according to the second embodiment may adopt the technical features of the first embodiment.

The light emitting device 102 according to the second embodiment may further includes an electrode layer 155 formed at a lateral side of the second conductive semiconductor layer 146. For instance, the electrode layer 155 may surround the lateral side of the second conductive semiconductor layer 146.

The electrode layer 155 may be electrically connected to the carbon nano electrode layer 150.

In addition, the electrode layer 155 may be formed on the top surface of the second conductive semiconductor layer 146 as well as at the lateral side of the second conductive semiconductor layer 146, and the embodiment is not limited thereto.

According to the second embodiment, since the electrode layer 155 is formed at an outer lateral side of the light emitting structure, the carrier injection efficiency to the light emitting structure can be improved, so that the light emitting efficiency can be increased.

For instance, it is necessary to sufficiently inject the carrier in order to maximize the light emitting efficiency of the light emitting structure having the coaxial structure. Since the conductive dielectric nano rod 130 serving as the coaxial center has the superior electric conductivity, the current injection efficiency can be maximized so that the carrier injected through the carbon nano electrode layer 150 having the superior electric conductivity can be sufficiently injected into the light emitting structure due to the electrode layer 155 having a maximum contact area with respect to the second conductive semiconductor layer 146, thereby improving the light emitting efficiency.

FIGS. 4 to 13 are sectional views showing the process for manufacturing a light emitting device according to the embodiment.

Figure 4:
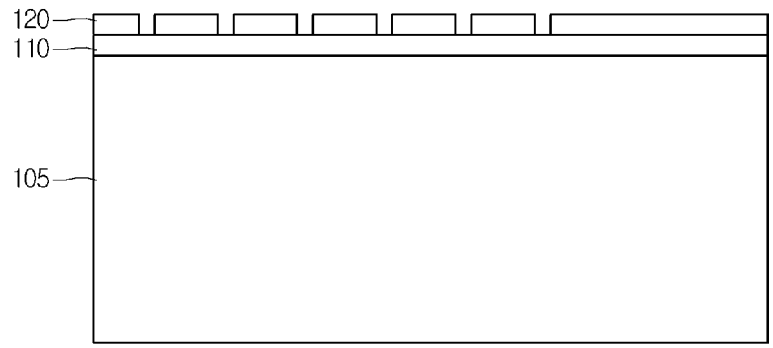
FIGS. 4 to 13 are sectional views showing the process for manufacturing a light emitting device according to the embodiment.

First, as shown in FIG. 4, the nitride semiconductor layer 110 may be formed on the substrate 105.

The substrate 105 may include a conductive substrate or an insulating substrate. For instance, the substrate 105 may include at least one of $Al_2O_3$, SiC, Si, GaAs, GaN, ZnO, GaP, InP, Ge, and $Ga_2O_3$. Although the insulating substrate, such as an $Al_2O_3$ substrate, is used as the substrate 105, the embodiment is not limited thereto.

According to the embodiment, the nitride semiconductor layer 110 may be formed on the substrate 105 so that the conductive dielectric nano rod 130, which is formed later, may be uniformly grown.

For instance, the nitride semiconductor layer 110 may be a GaN semiconductor layer and the conductive dielectric nano rod 130 can be uniformly formed while improving the reliability of the device operation due to the electrical and physical similarity between the GaN nitride semiconductor layer and the conductive dielectric nano rod 130 to be formed later.

According to the embodiment, the nitride semiconductor layer 110 has a thickness of about 1 μm or less, so that the conductive dielectric nano rod 130, which is formed later, can be uniformly formed without the defect, such as crack.

Then, the first insulating layer 120, which exposes a region through a hole where the conductive dielectric nano rod 130 is to be formed, is formed on the nitride semiconductor layer 110. For instance, after forming an initial insulating layer (not shown), the initial insulating layer is patterned by using an etching mask (not shown) to form the first insulating layer 120. Due to the first insulating layer 120, the distribution and alignment of the conductive dielectric nano rod 130 to be formed later can be controlled. The first insulating layer 120 may include an oxide layer pattern or a nitride layer pattern, but the embodiment is not limited thereto.

Figure 5:
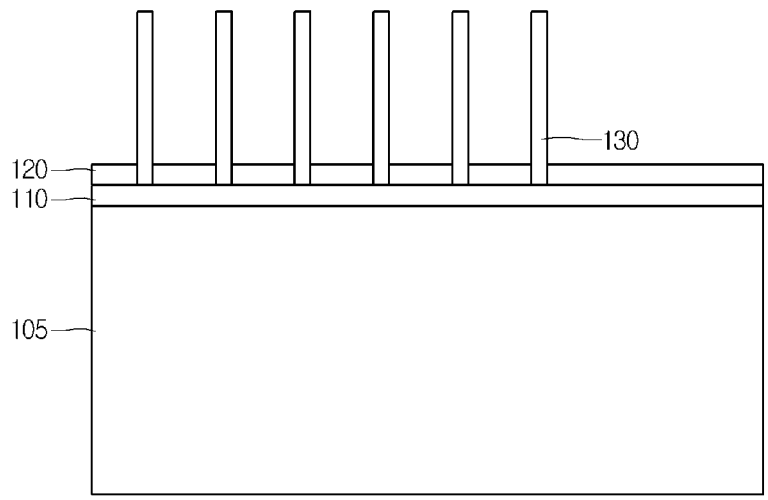

After that, as shown in FIG. 5, the conductive dielectric nano rod 130 may be formed on the nitride semiconductor layer 110 exposed by the first insulating layer 120. According to the embodiment, the conductive dielectric nano rod 130 may include a ZnO nano rod, but the embodiment is not limited thereto.

For instance, the ZnO nano rod may be grown on the nitride semiconductor layer 110 through the hydrothermal synthesis method, but the embodiment is not limited thereto. For instance, a ZnO seed layer may be formed through a coating scheme.

Then, zinc nitrate hexahydrate and hexamethylenetetramine are dissolved in deionized water while applying heat such that they are ionized into $Zn^{2+}$ and $OH^-$, and then the ions are bonded with each other to grow the ZnO nano rod on the ZnO seed layer, but the embodiment is not limited thereto.

According to the embodiment, the ZnO nano rod 130 may be grown at the low temperature of about 90° C. through the hydrothermal method and the density and length of the nano rod may be adjusted depending on the growth time and concentration.

According to the embodiment, the ZnO nano rod 130 may be grown at the low temperature, so the damage to the device may be minimized, so that the operating voltage of the light emitting device can be reduced.

According to the embodiment, it is necessary to sufficiently inject the carrier in order to maximize the light emitting efficiency of the light emitting structure having the coaxial structure. Since the conductive dielectric nano rod 130 serving as the coaxial center has the superior electric conductivity, the current injection efficiency can be maximized so that the carrier can be sufficiently injected into the light emitting structure, thereby improving the light emitting efficiency.

Figure 6:
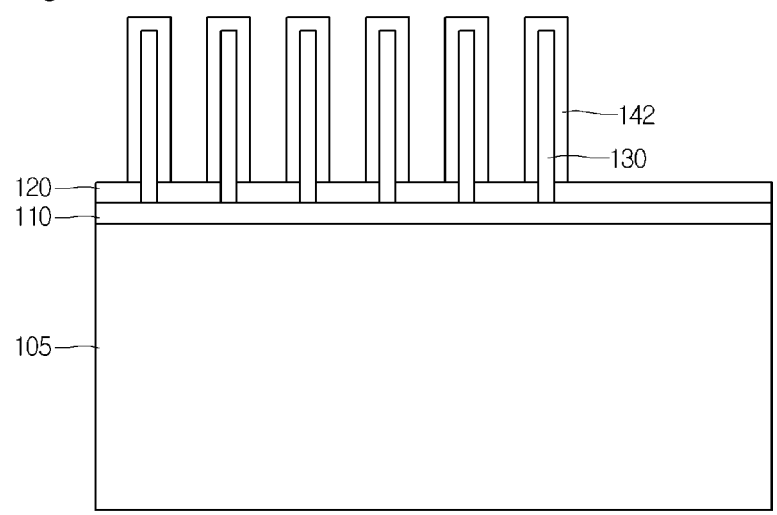
Figure 7:
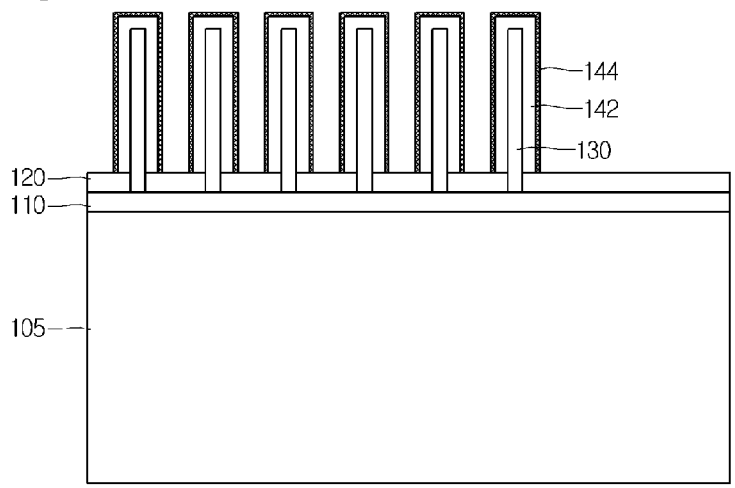
Figure 8:
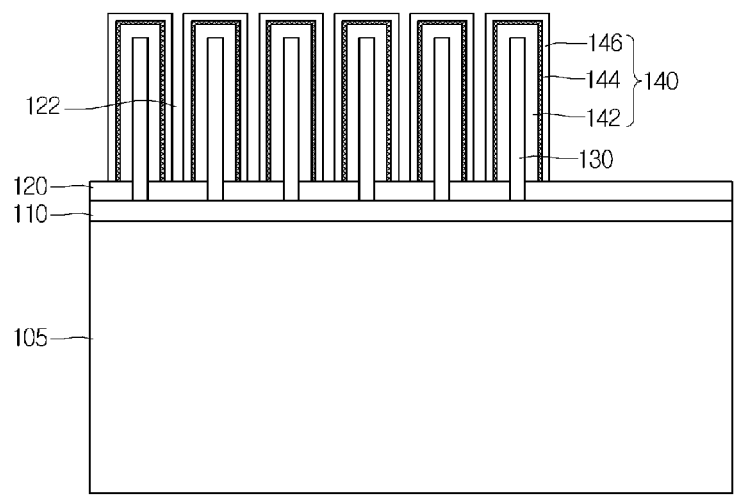

After that, as shown in FIGS. 6 to 8, the light emitting structures 140 having the coaxial structure may be formed on the conductive dielectric nano rods 130, respectively. For instance, the light emitting structures 140 may surround the conductive dielectric nano rods 130.

The light emitting structure 140 may be formed on the conductive dielectric nano rod 130 through MOVPE (Metal-Organic Vapor-Phase Epitaxy), CVD (Chemical Vapor Deposition), MBE (Molecular Beam Epitaxy), or HVPE (Hydride Vapor Phase Epitaxy), but the embodiment is not limited thereto.

For instance, the light emitting structure 140 may include the first conductive semiconductor layer 142 that surrounds the conductive dielectric nano rods 130.

The first conductive semiconductor layer 142 may include group III-V compound semiconductor doped with a first conductive dopant. If the first conductive semiconductor layer 142 is an N type semiconductor layer, the first conductive dopant may include an N type dopant, such as Si, Ge, Sn, Se, or Te, but the embodiment is not limited thereto.

The first conductive semiconductor layer 142 may include a semiconductor material having a compositional formula of $In_xAl_yGa_{1-x-y}N$ ($0 \leq x \leq 1$, $0 \leq y \leq 1$, $0 \leq x+y \leq 1$). For instance, the first conductive semiconductor layer 142 may include at least one of GaN, InN, AlN, InGaN, AlGaN, InAlGaN, AlInN, AlGaAs, InGaAs, AlInGaAs, GaP, AlGaP, InGaP, AlInGaP, and InP.

According to the embodiment, when the first conductive semiconductor layer 142 is a GaN semiconductor layer, the first conductive semiconductor layer 142 can be uniformly formed due to the electrical and physical similarity between the first conductive semiconductor layer 142 and the conductive dielectric nano rods 130.

Then, as shown in FIG. 7, the active layer 144 may be formed to surround the first conductive semiconductor layer 142. The active layer 144 may have at least one of a single quantum well structure, a multi-quantum well structure, a quantum-wire structure and a quantum dot structure.

For instance, the well/barrier layer of the active layer 144 may include at least one of InGaN/GaN, InGaN/InGaN, GaN/AlGaN, InAlGaN/GaN, GaAs(InGaAs)/AlGaAs, and GaP(InGaP)/AlGaP, but the embodiment is not limited thereto.

Then, as shown in FIG. 8, the second conductive semiconductor layer 146 may be formed to surround the active layer 144.

The second conductive semiconductor layer 146 may include group III-V compound semiconductor doped with a second conductive dopant, for instance, a semiconductor material having a compositional formula of $In_xAl_yGa_{1-x-y}N$ ($0 \leq x \leq 1$, $0 \leq y \leq 1$, $0 \leq x+y \leq 1$). If the second conductive semiconductor layer 146 is a P type semiconductor layer, the second conductive dopant includes a P type dopant, such as Mg, Zn, Ca, Sr or Ba.

Therefore, the first conductive semiconductor layer 142, the active layer and the second conductive semiconductor layer 146 can be formed as the coaxial structure.

For instance, the first conductive semiconductor layer 142, the active layer and the second conductive semiconductor layer 146 can be formed as the coaxial structure about the conductive dielectric nano rod 130.

According to the embodiment, since the light emitting structure has the coaxial structure, the internal quantum efficiency can be significantly increased. For instance, as shown in FIG. 1, the light emitting structure according to the embodiment is formed from a lower portion to an upper portion of the conductive dielectric nano rod 130, so the area of the active layer 144 can be significantly enlarged. In addition, since a plurality of nano rod type light emitting structures including the enlarged light emitting area are provided, the internal quantum efficiency can be remarkably increased as compared with the light emitting device according to the related art.

According to the embodiment, second insulating layers 122 may be interposed between the light emitting structures 140 formed on the conductive dielectric nano rods 130, respectively, thereby preventing the electric short from occurring between the light emitting structures 140. For instance, the second insulating layers 122 may include an SOG (spin on glass) layer, but the embodiment is not limited thereto.

According to the embodiment, the conductive dielectric nano rod 130 may be disposed at the coaxial center of the light emitting structure 140 so that the light scattering effect and the light transmittance can be improved.

In addition, according to the embodiment, since the conductive dielectric nano rod 130 has superior electric conductivity, the conductive dielectric nano rod 130 can electrically make ohmic-contact with the first conductive semiconductor layer 142 of the light emitting structure 140, so that the carrier can be effectively injected into the light emitting structure 140, thereby maximizing the light emitting efficiency.

Further, according to the embodiment, since the light emitting structure has the coaxial nano rod structure, the loss of light absorbed in the electrode can be reduced and the surface area for light extraction can be increased so that the light extraction efficiency can be increased.

Figure 9:
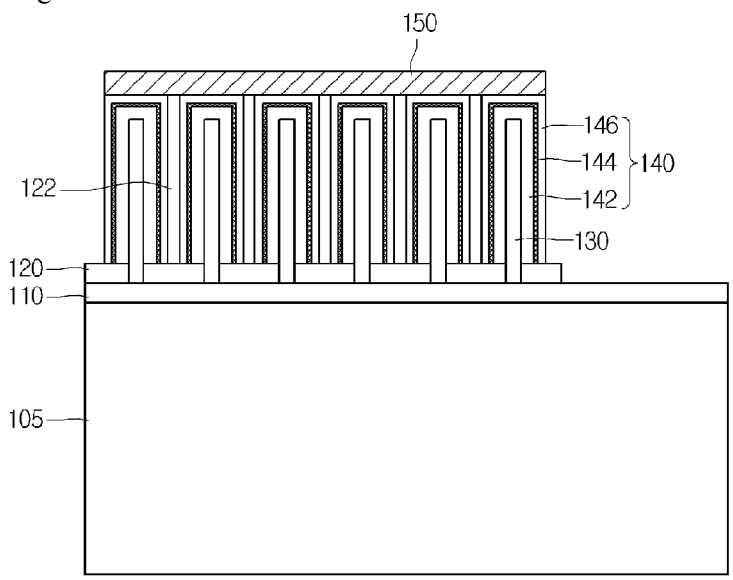

Then, as shown in FIG. 9, the carbon nano electrode layer 150 may be formed on the light emitting structure 140.

For instance, after aligning the carbon nano electrode layer 150 on the light emitting structure 140, the rapid thermal annealing (RTA) process is performed for about 15 minutes to about 25 minutes at the temperature of about 340° C. to about 350° C. to form the carbon nano electrode layer 150 on the light emitting structure 140, but the embodiment is not limited thereto.

According to the embodiment, the carbon nano electrode layer 150 may include a graphene layer, but the embodiment is not limited thereto.

The carbon nano electrode layer 150 according to the embodiment may be prepared in the form of a single atom graphene layer or a multiple atom graphene layer.

In addition, the carbon nano electrode layer 150 may be prepared in the form of a single layer, a porous layer, or a stripe net having a predetermined pattern, but the embodiment is not limited thereto.

In order to enhance the electric conductivity and the thermal conductivity, the carbon nano electrode layer 150 may have a thickness in the range of 0.1 nm to 100 nm. If the thickness of the carbon nano electrode layer 150 exceeds 100 nm, light absorption in the carbon nano electrode layer 150 is increased so that the characteristic of the light emitting device 100 may be lowered.

In addition, the carbon nano electrode layer 150 may have a thickness in the range of 0.2 nm to 0.325 nm. In this case, the carbon nano electrode layer 150 can be easily formed and may have high electric conductivity and high light transmittance.

According to the embodiment, since the carbon nano layer having high thermal conductivity and electric conductivity is used as an electrode layer, the carrier injection efficiency to the light emitting structure having the coaxial structure, in which the light emitting area is significantly increased, can be improved so that the light emitting efficiency can be maximally enhanced.

In addition, according to the embodiment, the carbon nano layer having high thermal conductivity and electric conductivity and superior transparency is used as a transparent electrode layer of the nitride semiconductor light emitting device, so the loss of light absorbed in the electrode can be reduced, thereby improving the light extraction efficiency.

Figure 10:
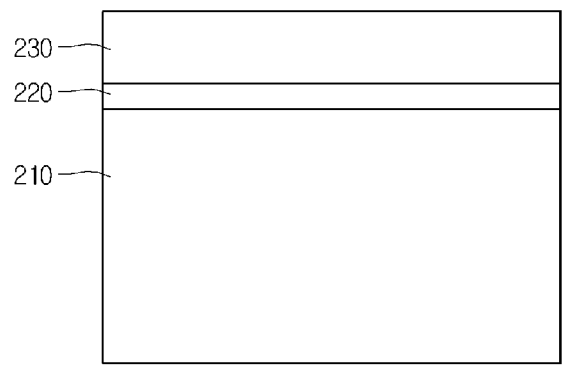
Figure 11:
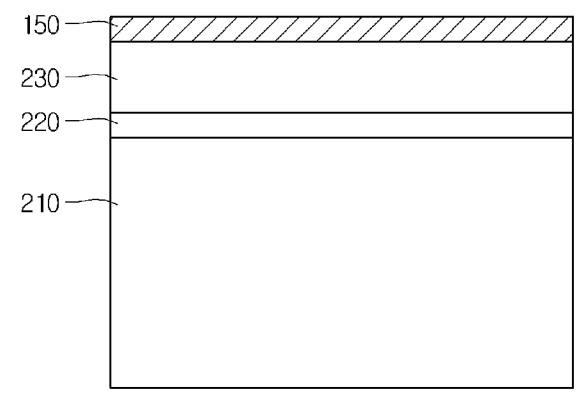
Figure 12:
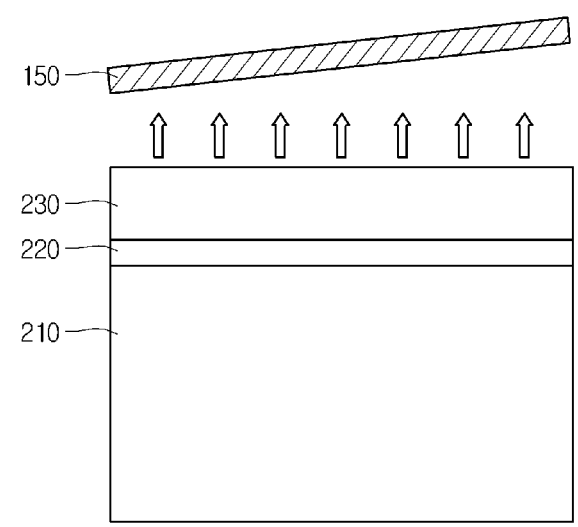

FIGS. 10 to 12 are sectional views to explain the preparation process for the graphene carbon nano electrode layer 150, but the embodiment is not limited thereto.

First, as shown in FIG. 10, a silicon oxide 220 may be formed on a silicon substrate 210 and then a metal layer 230 may be formed. The metal layer 230 may be a nickel (Ni) metal layer, but the embodiment is not limited thereto.

Then, the graphene carbon nano metal layer is grown on the metal layer 230. The graphene carbon nano metal layer may be grown by implanting methane gas and Ar gas through the CVD process, but the embodiment is not limited thereto.

In addition, the carbon nano electrode layer 150 may have a thickness in the range of 0.2 nm to 0.325 nm. In this case, the carbon nano electrode layer 150 can be easily formed and may have high electric conductivity and high light transmittance, but the embodiment is not limited thereto.

After that, a second electrode (not shown) may be formed on the graphene carbon nano electrode layer 150. The second electrode may include at least one of Cr, Al, Ni and Au, but the embodiment is not limited thereto.

Then, as shown in FIG. 12, the graphene carbon nano electrode layer 150 may be separated from the metal layer 230. For instance, the graphene carbon nano electrode layer 150 may be separated by using Ni etchant, but the embodiment is not limited thereto.

Next, after aligning the carbon nano electrode layer 150 on the light emitting structure 140, the rapid thermal annealing (RTA) process is performed to form the carbon nano electrode layer 150 on the light emitting structure 140, but the embodiment is not limited thereto.

Figure 13:
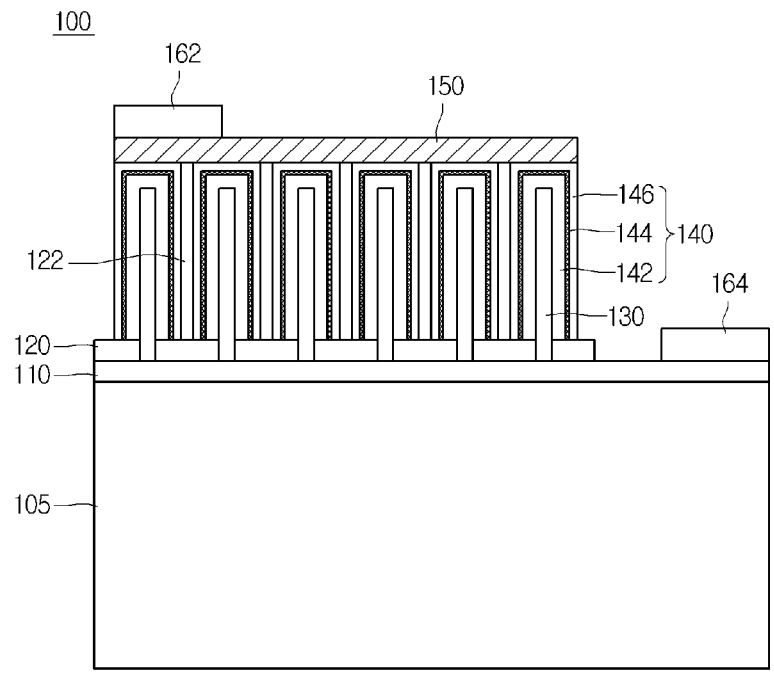

After that, as shown in FIG. 13, a first pad 62 may be formed on the carbon nano electrode layer 150 and a second pad 164 may be formed on the exposed nitride semiconductor layer 110 after removing the first insulating layer 120 from a region where the second pad 164 is to be formed.

Meanwhile, as shown in FIG. 3, the light emitting device according to the second embodiment may further includes an electrode layer 155 formed at a lateral side of the second conductive semiconductor layer 146. For instance, the electrode layer 155 may surround the lateral side of the second conductive semiconductor layer 146.

The electrode layer 155 may improve the light extraction efficiency by employing a transparent electrode layer and may be electrically connected to the carbon nano electrode layer 150.

In addition, the electrode layer 155 may be formed on the top surface of the second conductive semiconductor layer 146 as well as at the lateral side of the second conductive semiconductor layer 146, and the embodiment is not limited thereto.

According to the second embodiment, since the electrode layer 155 is formed at an outer lateral side of the light emitting structure, the carrier injection efficiency to the light emitting structure can be improved, so that the light emitting efficiency can be increased.

For instance, it is necessary to sufficiently inject the carrier in order to maximize the light emitting efficiency of the light emitting structure having the coaxial structure. Since the conductive dielectric nano rod 130 serving as the coaxial center has the superior electric conductivity, the current injection efficiency can be maximized so that the carrier injected through the carbon nano electrode layer 150 having the superior electric conductivity can be sufficiently injected into the light emitting structure due to the electrode layer 155 having a maximum contact area with respect to the second conductive semiconductor layer 146, thereby improving the light emitting efficiency.

The embodiment can provide a light emitting device capable of enhancing the intensity of light by improving a transparent ohmic layer, a method of manufacturing the same, a light emitting device package, and a lighting system.

Further, the embodiment can provide a light emitting device having high performance by improving light emitting efficiency and reliability, a method of manufacturing the same, a light emitting device package, and a lighting system.

For instance, according to the embodiment, the carbon nano layer having high thermal conductivity and electric conductivity and superior transparency is used as a transparent electrode layer of the nitride semiconductor light emitting device and the light emitting structure having the coaxial nano rod structure is employed, so the loss of light absorbed in the electrode can be reduced and the surface area for the light extraction can be increased, thereby improving the light extraction efficiency.

In addition, according to the embodiment, a flexible device structure having the superior mechanical property can be realized by hybridizing the carbon nano layer and the light emitting structure having the coaxial nano rod structure.

Figure 14:
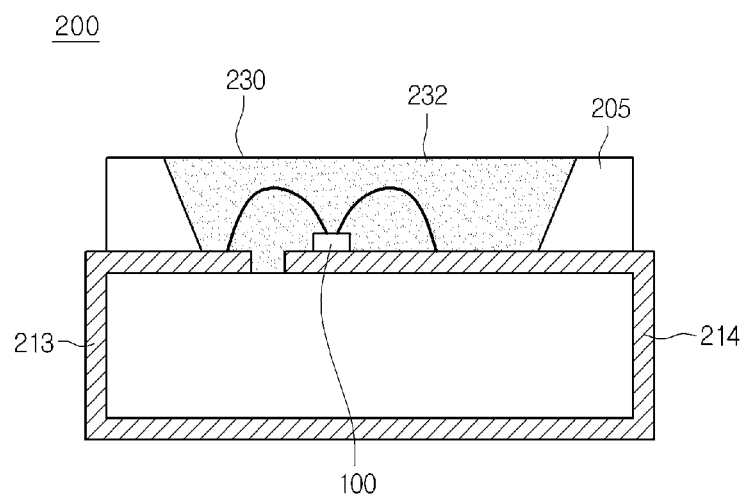
FIG. 14 is sectional view of a light emitting package according to the embodiment.

FIG. 14 is a view showing a light emitting device package 200 in which a light emitting device according to the embodiments is installed.

The light emitting device package 200 according to the embodiment includes a package body 205, third and second lead electrodes 213 and 214 formed on the package body 205, the light emitting device 100 according to the embodiment, which is installed in the package body 205 and electrically connected to the third and second lead electrodes 213 and 214, and a molding member 230 surrounding the light emitting device 100.

The package body 205 may include silicon, synthetic resin, or metallic material. An inclined surface may be formed around the light emitting device 100.

The third and fourth lead electrodes 213 and 214 are electrically insulated from each other and supply power to the light emitting device 100. The third and second lead electrodes 213 and 214 may reflect light emitted from the light emitting device 100 to increase light efficiency, and may dissipate heat generated from the light emitting device 100 to the outside.

The light emitting device 100 may include a lateral type light emitting device shown in FIG. 1, but the embodiment is not limited thereto. In addition, the light emitting device 100 may include a vertical type light emitting device.

The light emitting device 100 may be mounted on the package body 205 or on the third lead electrode 213 or the fourth lead electrode 214.

The light emitting device 100 may be electrically connected with the third lead electrode 213 and/or the fourth lead electrode 214 through one of a wire scheme, a flip chip scheme and a die bonding scheme. Although FIG. 5 shows that the light emitting device 100 is electrically connected with the third lead electrode 213 and the fourth lead electrode 214 through a wire, the embodiment is not limited thereto.

The molding member 230 may protect the light emitting device 100 by surrounding the light emitting device 100. In addition, the molding member 230 may include phosphors (232) to change the wavelength of light emitted from the light emitting device 100.

Figure 15:
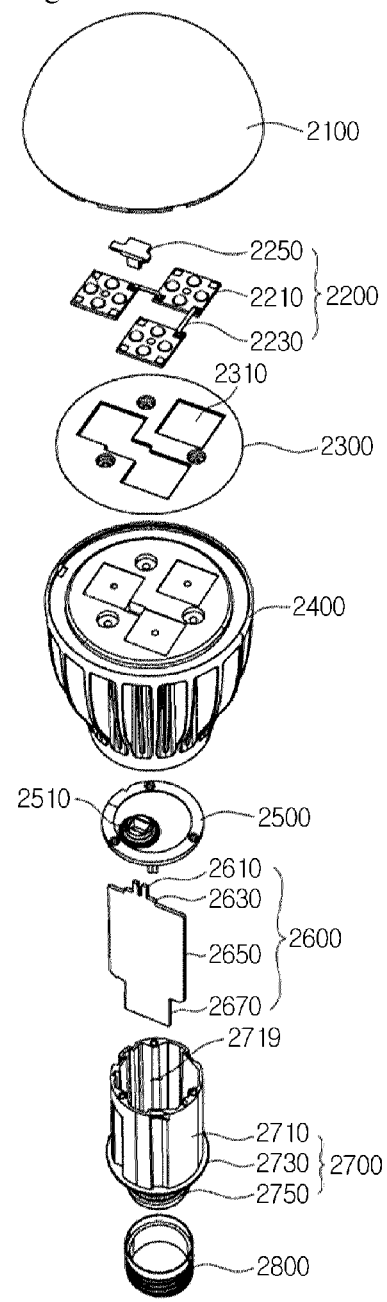
FIGS. 15 to 17 are exploded perspective views showing examples of a lighting system including a light emitting device according to the embodiment.
Figure 16:
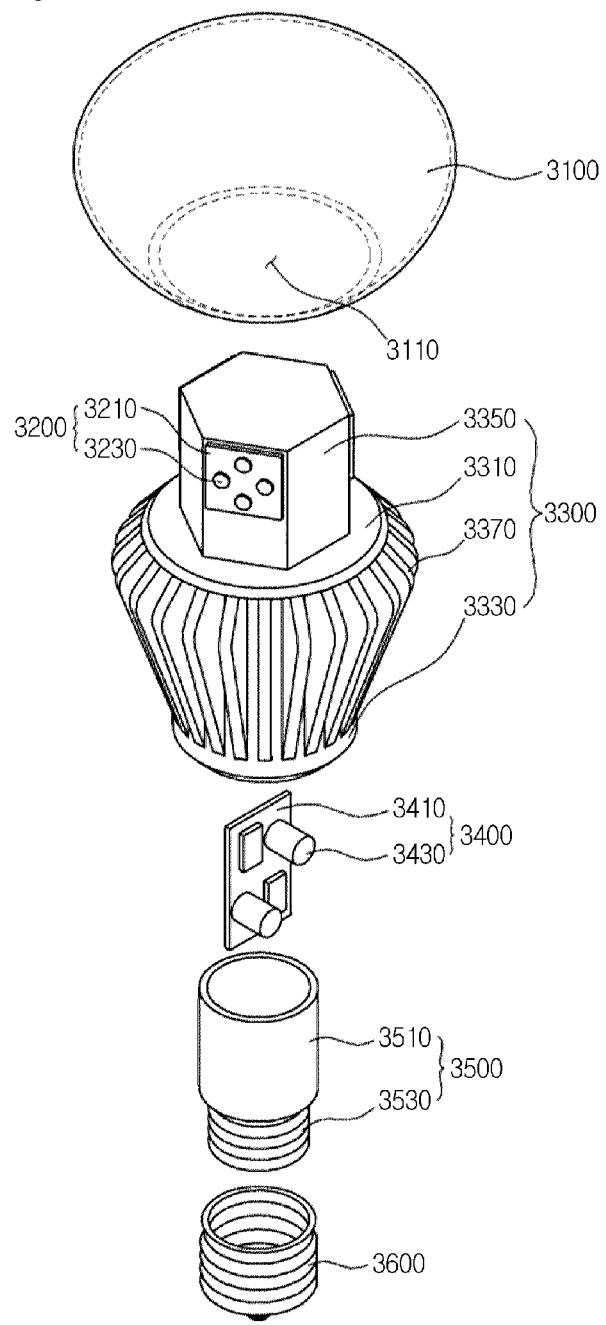
Figure 17:
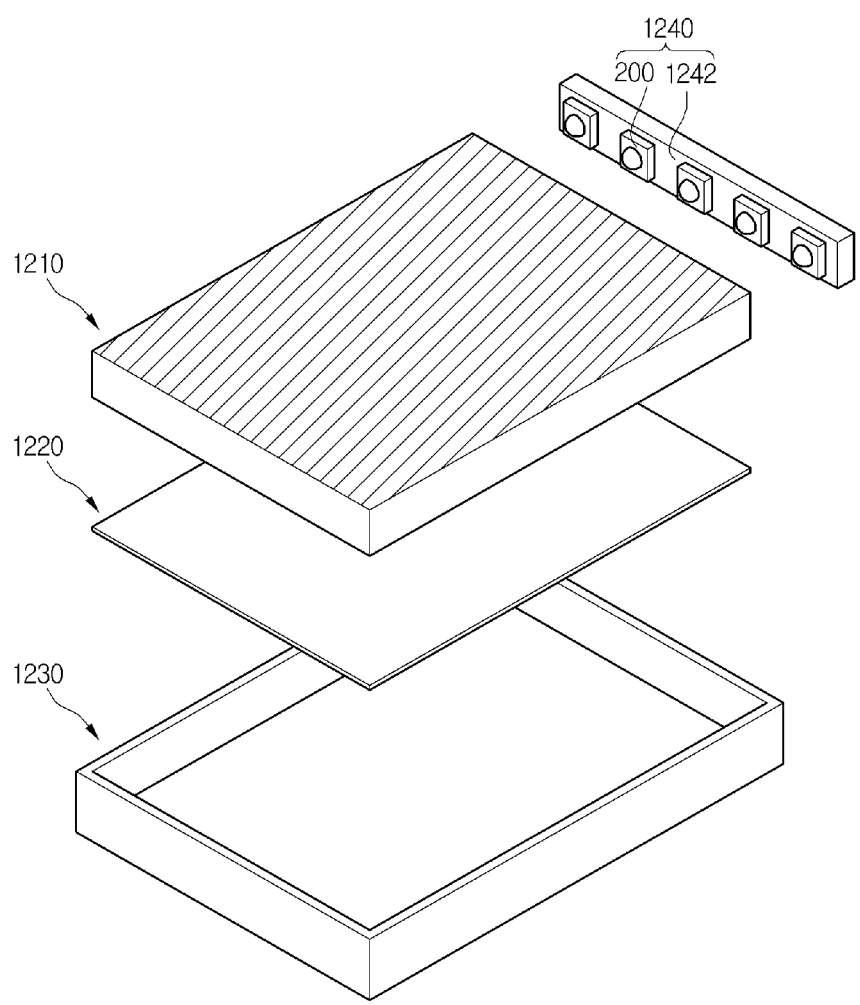

FIGS. 15 to 17 are exploded perspective views showing examples of a lighting system including a light emitting device according to the embodiment.

As shown in FIG. 15, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 3100 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire and a" – electric wire are electrically connected to the extension part 2670 and second terminals of the + electric wire and the – electric wire may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

As shown in FIG. 16, the lighting system according to the embodiment may include a cover 3100, a light source part 3200, a radiator 3300, a circuit part 3400, an inner case 3500, and a socket 3600. The light source part 3200 may include the light emitting device or the light emitting device module according to the embodiment.

The cover 3100 may have a blub shape and is hollow. The cover 3100 has an opening 3110. The light source part 3200 and a member 3350 may be inserted through the opening 3110.

The cover 3100 may be coupled with the radiator 3300, and may surround the light source part 3200 and the member 3350. The light source part 3200 and the member 3350 may be blocked from the outside by the coupling between the cover 3100 and the radiator 3300. The cover 3100 may be coupled with the radiator 3300 by an adhesive or various schemes such as a rotation coupling scheme and a hook coupling scheme. The rotation coupling scheme is a scheme where a thread of the cover 3100 is coupled with a screw groove of the radiator 3300, and the cover 3100 is coupled with the radiator 3300 by rotation of the cover 3100. The hook coupling scheme is a scheme where a projection of the cover 3100 is inserted into a groove of the radiator 3300 so that the cover 3100 is coupled with the radiator 3300.

The cover 3100 may be optically coupled with the light source part 3200. In detail, the cover 3100 may diffuse, scatter, or excite light provided from a light emitting device 3230 of the light source part 3200. The cover 3100 may be a type of optical member. The cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

For example, a material of the cover 3100 may include glass, plastic, polypropylene (PP), polyethylene (PE), and polycarbonate (PC). The polycarbonate (PC) has the superior light resistance, heat resistance and strength among the above materials. The cover 3100 may be transparent so that a user may view the light source module 2200 from the outside, or opaque. The cover 3100 may be formed through a blow molding scheme.

The light source part 3200 is disposed at the member 3350 of the radiator 3300, and a plurality of light source part may be disposed. In detail, the light source part 3200 may be disposed in at least one of a plurality of lateral sides of the member 3350. A top end of the light source part 3200 of the light source part 3200 may be disposed at the lateral side of the member 3350.

The light source part 3200 may be disposed at three of six lateral sides of the member 3350. However, the embodiment is not limited thereto, and the light source part 3200 may be disposed at all lateral sides of the member 3350. The light source part 3200 may include a substrate 3210 and a light emitting device 3230. The light emitting device 32030 may be disposed on one surface of the substrate 3210.

The substrate 3210 has a rectangular shape, but the embodiment is not limited thereto. The substrate 3210 may have various shapes. For example, the substrate 3210 may have a circular shape or a polygonal shape. The substrate 3210 may be provided by printing a circuit pattern on an insulator. For example, the typical printed circuit board (PCB) may include a metal core PCB, a flexible PCB, and a ceramic PCB. In addition, the substrate may have a COB (chips on board) type in which LED chips, which are not packaged, are directly bonded on the PCB. In addition, the substrate 3210 may include a material to effectively reflect light, or the surface of the substrate may have a color such as a gold color or a silver color to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting device 3230 may include a light emitting diode chip to emit red, green, and blue lights or a light emitting diode chip to emit UV. The light emitting diode may have the lateral type or the vertical type. The light emitting diode may emit one of blue, red, yellow, and green lights.

The light emitting device 3230 may include a luminescence material. The luminescence material may include at least one of garnet-based phosphors (YAG, or TAG), silicate-based phosphors, nitride-based phosphors, and oxynitride-based phosphors. The luminescence material may include at least one of a red luminescence material, a yellow luminescence material and a green luminescence material.

The radiator 3300 is coupled with the cover 3100, and may radiate heat from the light source part 3200. The radiator 330 has a predetermined volume, and includes a top surface 3310 and a lateral side 3330. The member 3350 may be disposed on the top surface 3310 of the radiator 3310. The top surface 3310 of the radiator 3300 may be coupled with the cover 3100. The top surface of the radiator 3300 may have a shape corresponding to an opening 3110 of the cover 3100.

A plurality of heat radiation pins 3370 may be disposed at the lateral side 3330 of the radiator 3300. The heat radiation pin 3370 may extend outward from the lateral side of the radiator 3300 or may be connected to the lateral side of the radiator 3300. The heat radiation pin 3370 may improve heat radiation efficiency by increasing a heat radiation area of the radiator 3300. The lateral side 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six lateral sides. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at six lateral sides of the member 3350. The light source part 3200 may be disposed at all or some of the six lateral sides of the member 3350. The light source part 3200 is disposed at three of the six lateral sides of the member 3350 in FIG. 16.

The substrate 3210 is disposed at the lateral side of the member 3350. The lateral side of the member 3350 may be substantially vertical to the top surface of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), or tin (Sn). The member 3350 may include a plastic material having thermal conductivity. The plastic material having thermal conductivity is lighter than the metal and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and may be received in the radiator 3300 together with the inner case 3500. The circuit part 3400 may include a circuit board 3410 and a plurality of components mounted on the circuit board 3410.

The circuit board 3410 has a circular shape, but the embodiment is not limited thereto. That is, the circuit board 3410 may have various shapes. For example, the circuit board may have an elliptical shape or a polygonal shape. The circuit board 3410 may be provided by printing a circuit pattern on an insulator.

The circuit board 3410 is electrically connected to the substrate 3210 of the light source part 3200. For example, the circuit part 3410 and the substrate 3210 may be connected to each other by a wire. The wire may be disposed inside the radiator 3300 to connect the substrate 3210 with the circuit board 3410.

For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be changed according to the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled with the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled with the inner case 3500. In detail, the socket 3600 may be coupled with the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. If external power is applied to the socket 3600, the external power may be transferred to the circuit part 3400. The socket 360 may have a screw groove structure corresponding to a thread structure of the connecting part 3550.

Further, as shown in FIG. 17, the lighting system according to the embodiment, for example, a backlight unit includes a light guide plate 1210, a light emitting module 1240 for providing the light to the light guide plate 1210, a reflective member 1220 positioned below the light guide plate 1210, and a bottom cover 1230 for receiving the light guide plate 1210, the light emitting module 1240, and the reflective member 1220 therein, but the embodiment is not limited thereto.

The light guide plate 1210 diffuses the light to provide surface light. The light guide plate 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB) as well as a typical PCB, but the embodiment is not limited thereto.

In addition, the light emitting device packages 200 are arranged on the substrate 1242 such that light exit surfaces of the light emitting device packages 200 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

As described above, according to the light emitting device, a method of fabricating the light emitting device, the light emitting device package, and the lighting system of the embodiment, the electron blocking function can be improved and the hole injection efficiency can be enhanced, so that the light efficiency can be significantly improved.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A plurality of light emitting device packages according to the embodiment may be arrayed on the substrate and the light guide plate, the prism sheet, the diffusion sheet and the fluorescent sheet serving as optical members may be disposed on a path of light emitted from the light emitting device packages. The light emitting packages, the substrate, and the optical member may serve as the backlight unit or a lighting unit. For example, the lighting system may include the backlight unit, the lighting unit, an indicator, a lamp, or a street lamp.

The invention claimed is:

1. A light emitting device comprising:
a substrate;
a plurality of conductive dielectric nano rods spaced apart from each other on the substrate;
light emitting structures including an active layer on the conductive dielectric nano rods, respectively;
a carbon nano electrode layer on the light emitting structures;
an electrode layer disposed at a lateral side of the light emitting structures, and
a second insulating layer interposed between the light emitting structures on the conductive dielectric nano rods,
wherein the light emitting structures surround the conductive dielectric nano rods, respectively, and
wherein a top surface of the second insulating layer is higher than a top most surface of the active layer.

2. The light emitting device of claim 1, wherein each of the light emitting structures comprises:
a first conductive semiconductor layer surrounding the conductive dielectric nano rod;
the active layer on the first conductive semiconductor layer; and
a second conductive semiconductor layer on the active layer.

3. The light emitting device of claim 2, wherein the active layer surrounds the first conductive semiconductor layer and the second conductive semiconductor layer surrounds the active layer.

4. The light emitting device of claim 2, further comprising a nitride semiconductor layer between the substrate and the conductive dielectric nano rod.

5. The light emitting device of claim 4, further comprising a first insulating layer on the nitride semiconductor layer, and the first insulating layer comprises a hole,
the conductive dielectric nano rod is on the nitride semiconductor layer through the hole.

6. The light emitting device of claim 2, wherein the conductive dielectric nano rod comprises a ZnO nano rod.

7. The light emitting device of claim 2, wherein the carbon nano electrode layer comprises a graphene layer.

8. The light emitting device of claim 2, wherein the electrode layer is disposed at a lateral side of the second conductive semiconductor layer of the light emitting structures.

9. The light emitting device of claim 8, wherein the electrode layer surrounds a lateral side of the second conductive semiconductor layer.

10. The light emitting device of claim 8, wherein the electrode layer is electrically connected to the carbon nano electrode layer.

11. The light emitting device of claim 8, wherein the electrode layer is further formed on a top surface of the second conductive semiconductor layer.

12. The light emitting device of claim 2, wherein each the second conductive semiconductor layer is separated by the second insulating layer.

13. A light emitting device package comprising:
a light emitting device according to claim 1 and
a package body where the light emitting device is disposed.

14. The light emitting device package of claim 13, wherein the electrode layer is electrically connected to the carbon nano electrode layer.

15. The light emitting device of claim package 13, wherein the electrode layer is further formed on a top surface of the second conductive semiconductor layer.

16. A light emitting device comprising:
a substrate;
a plurality of conductive dielectric nano rods spaced apart from each other on the substrate;
light emitting structures including an active layer on the conductive dielectric nano rods, respectively;
a carbon nano electrode layer on the light emitting structures;
an electrode layer disposed at a lateral side of the light emitting structures, and
a second insulating layer interposed between the light emitting structures on the conductive dielectric nano rods,
wherein the light emitting structures have a coaxial structure, and
wherein a top surface of the second insulating layer is higher than a top most surface of the active layer.

17. The light emitting device of claim 16, wherein each of the light emitting structures comprises:

a first conductive semiconductor layer surrounding the conductive dielectric nano rod;

the active layer on the first conductive semiconductor layer; and a second conductive semiconductor layer on the active layer, wherein the first conductive semiconductor layer, the active layer and the second conductive semiconductor layer are coaxially formed about the conductive dielectric nano rod.

18. The light emitting device of claim 17, further comprising a nitride semiconductor layer between the substrate and the conductive dielectric nano rod.

19. The light emitting device of claim 17, further comprising an first insulating layer interposed between the conductive dielectric nano rods.

20. The light emitting device of claim 17, wherein each the second conductive semiconductor layer is separated by the second insulating layer.

* * * * *